United States Patent [19]

Stein

[11] Patent Number: 5,461,395
[45] Date of Patent: Oct. 24, 1995

[54] PLASMA ADDRESSING STRUCTURE HAVING A PLIANT DIELECTRIC LAYER

[75] Inventor: William W. Stein, Beaverton, Oreg.

[73] Assignee: Tektronix, Inc., Wilsonville, Oreg.

[21] Appl. No.: 27,964

[22] Filed: Mar. 8, 1993

[51] Int. Cl.⁶ .................................................. G09G 3/28
[52] U.S. Cl. ............................ 345/60; 313/586; 345/87
[58] Field of Search ...................... 345/60, 87, 62, 345/71; 313/484, 582, 584, 586, 585

[56] References Cited

U.S. PATENT DOCUMENTS

| | | | |
|---|---|---|---|
| 3,848,248 | 11/1974 | MacIntyre, Jr. | 345/60 |
| 4,896,149 | 1/1990 | Buzak et al. | 340/794 |
| 4,902,769 | 2/1990 | Cassidy et al. | 528/125 |
| 5,077,553 | 12/1991 | Buzak | 340/794 |

OTHER PUBLICATIONS

*Polymers Derived from Hexafluoroacetone: 12F–Poly(ether ketone)* by Gordeon L. Tullos and Patrick E. Cassidy, Macromolecules, vol. 24, No. 23, 1991, pp. 6059–6064.

*Encyclopedia of Chemical Technology*, Third Edition. vol. 18 "Plant–Growth Substances to Potassium Compounds," pp. 704–719.

*Primary Examiner*—Tommy P. Chin
*Assistant Examiner*—A. Au
*Attorney, Agent, or Firm*—Craig S. Jepson; Richard B. Preiss; John D. Winkelman

[57] ABSTRACT

A plasma addressing structure having data storage elements (16) uses an ionizable gas to store data in and read data out of the storage elements. The storage elements are defined by the overlapping areas of multiple column electrodes (18) extending in a common direction on a first substrate (22) and multiple channels (20) extending in a common direction on a second substrate (24). A layer of pliant dielectric material (26) separates the first and the second substrates, which are positioned face to face and spaced apart with the direction of the channels transverse to that of the column electrodes. Each of the channels is filled with an ionizable gas and includes two electrodes (46 and 48) electrically isolated from each other. The ionizable gas functions as an electrical switch. The storage element includes a layer (32) of liquid crystal material and receives incident image-carrying light.

11 Claims, 2 Drawing Sheets

PLASMA ADDRESSING STRUCTURE HAVING A PLIANT DIELECTRIC LAYER

TECHNICAL FIELD

The present invention relates to dielectric layers in video cameras, memory devices, display screens, storage devices, and other systems constructed of data storage elements which employ an ionizable gas to address such storage elements.

BACKGROUND OF THE INVENTION

Plasma addressing structures may be employed in a variety of applications, including video cameras, memory devices, and flat panel displays, including flat panel liquid crystal displays. Such addressing structures and storage devices are described in U.S. Pat. No. 4,896,149 to Buzak et al. for "Addressing Structure Using Ionizable Gaseous Medium" and in U.S. Pat. No. 5,077,553 to Buzak for "Apparatus and Method of Addressing Data Storage Elements," both assigned to the assignee of the present application.

One embodiment of a conventional plasma addressing structure includes a display screen with first and second spaced-apart glass substrates positioned face to face with each other. A layer of dielectric material and a layer of, for example, liquid crystal material separate the first and second substrate faces. Multiple parallel electrical conductors extend generally in a first direction along the inner surface of the first substrate to form column data electrodes for receiving data drive signals. Multiple parallel channels inscribed into the inner surface of the second substrate extend along the inner surface in a second direction generally transverse to the first direction.

Each of the channels is filled with ionizable gas. The gas is ionized by a gas ionizing structure that includes an electrical reference electrode or anode and a cathode that extend along the length of each channel. The gas in each channel is selectively ionized to address elements aligned with the channel. The addressable elements may include a row of display elements having electro-optical properties, such as the layer of liquid crystal material positioned between the inner surface of the first substrate and the dielectric layer.

Sidewalls between adjacent channels define a plurality of support structures whose top surfaces (referred to as "land areas") support the layer of dielectric material. The layer of dielectric material functions as an isolating barrier between the ionizable gas contained within the channels and the addressable elements. The dielectric material prevents the addressable material from flowing into the channels and prevents the ionizable gas from contaminating the addressable material.

The first and second substrates and the dielectric layer are typically bonded together along their boundary regions by glass frit. The fritting process usually is carried out in an oven at elevated temperatures under ambient nitrogen or oxygen. Heating at elevated temperature in ambient oxygen or nitrogen helps drive water vapor from the memory device, display screen, or other plasma addressed system. Water and other volatile species are believed to shorten the commercially useful life of such plasma addressed systems.

To retain desired electrical and optical qualities, the dielectric layer is preferably extremely thin. The dielectric layer has been formed of various materials, including glass, mica, or thermoplastic. Each of these materials has significant limitations and has proven unsatisfactory for some purposes. Bonding such materials to a substrate has also presented serious challenges.

A sheet of very thin glass is conventionally used as the dielectric layer in plasma addressed display screens. One example is Schott® D263 glass sheets which are 0.05 mm (2 mils) in depth (thickness), optically clear, thermally stable, durable, and nearly chemically pure. Such a thin glass sheet has been thought to have the most satisfactory combination of electrical, physical, and optical qualities of the materials commonly used as the dielectric layer in such displays. However, mating the thin glass sheet with the first and second glass substrates has proven difficult.

A thin glass sheet is extremely brittle, fragile, and difficult to handle. Glass frit or other particulate contamination on either the thin glass sheet or a land area often results in fracturing the glass sheet during bonding with the substrate layers. Consequently, the utmost care must be taken to avoid particulate contamination. A thin sheet of mica presents these same problems and in addition has less satisfactory optical properties than a glass sheet.

Additionally, glass sheets and mica sheets are available from a limited number of producers and in a limited number of sizes. Such thin glass sheets and thin mica sheets are also very expensive. Large sheets of thin glass, such as would be required for large screen flat panel displays, are unavailable. Consequently, the unavailability of large-sized, dielectric sheet material having desirable properties has placed an upper limit on the dimensions of the display area of plasma addressed display screens.

Thermoplastics are typically extruded. Thermoplastics tend to develop cracks, to scratch easily, and are difficult to obtain in sheets which are sufficiently thin and uniform. It is believed desirable that the dielectric layer bond only to the land areas rather than encroaching upon the channel sidewalls. Because thermoplastics are generally malleable and melt at low temperatures, thermoplastic sheets tend to deform unacceptably into the channels rather than spanning from land area to land area and remaining relatively flat and rigid. Additionally, many thermoplastics are not thermally stable and undergo unacceptable discoloration during the high temperature fritting cycle. Therefore, thermoplastics have not been used as dielectric layers for plasma addressed systems.

SUMMARY OF THE INVENTION

An object of the present invention is, therefore, to provide a plasma addressing structure having a pliant dielectric layer that exhibits desirable mechanical, thermal, optical, and electrical properties.

Another object of this invention is to provide a pliant dielectric layer that can be produced in a relatively large format allowing for the manufacture of large display screens and other plasma addressed systems.

A further object of this invention is to provide a pliant dielectric layer with thermal, optical, and electrical properties which compare favorably with thin, brittle glass sheets.

According to the present invention, a pliant dielectric layer is provided for placement between the inner surfaces of the first and second substrates in a plasma addressing structure. According to preferred embodiments, the pliant dielectric layer of the present invention comprises a polymer film. Suitable polymer films include polyethers, poly(ether ketones), polyether(ether ketones), polyimides, polyamides, poly(imide-amides), polyaromatic ethers, and their fluorinated derivatives including the fluorinated poly(phenylene ether ketone) series 12F-PEK, which is described more fully below.

Desirable properties of polymers useful for forming a pliant dielectric layer include low absorption of lightwaves in the visible region of the electromagnetic spectrum, retention of high optical clarity after thermal cycling at elevated temperature, and high thermal stability. With respect to properties other than trans-optical clarity, desirable properties include low light scattering, low birefringence, and low discoloration after either thermal cycling at elevated temperature or after exposure to light in the visible or near ultraviolet spectrum. Moreover, the polymers preferably have a high dielectric constant when made into a thin layer or film, a high electrical resistivity, and the ability to resist breakdown under high voltage.

The polymeric material of the dielectric layer of the present invention is preferably comprised of polymer components of uniformly high molecular weight. Lower molecular weight polymer components are thought to lead to undesirable discoloration when heated to elevated temperatures. The polymeric material also is preferably free of other low molecular weight components and contaminants. Low molecular weight components and contaminants may diffuse into the liquid crystal material, or other addressable material, and are believed to favor undesirable conductivity. Low absorption and low retention of water also are believed to be desirable properties of the polymeric dielectric material.

When formed as a thin layer or film of about 0.0125 mm to 0.075 mm (0.5 mil to 3 mils), the preferred polymer material has a high modulus of elasticity, shows good mechanical strength, has a substantially uniform thickness, and is free of holes or perforations. A coefficient of thermal expansion comparable to plasma glass is also desirable.

Polymer films used in display screens and other plasma addressable systems which are assembled using a high temperature cycle for glass fritting are capable of bonding readily with the glass frit and the glass substrate layers.

DETAILED DESCRIPTION OF THE PREFERRED EMBODIMENTS

Figure 1:
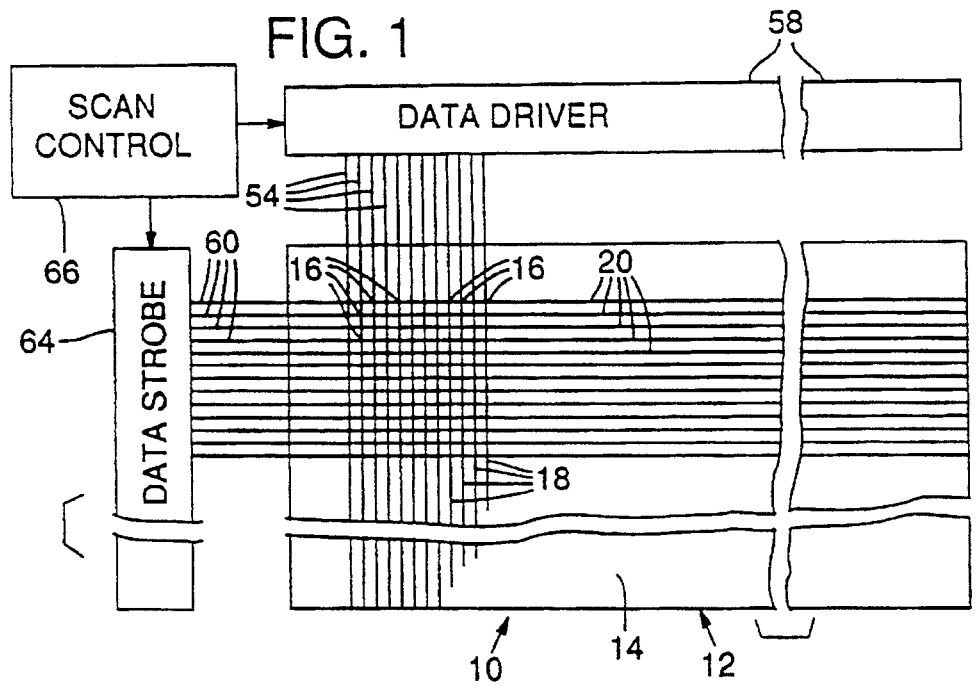
FIG. 1 is a diagram showing a frontal view of a display panel, with associated drive circuitry, employing a pliant dielectric layer of the present invention.
Figure 2:
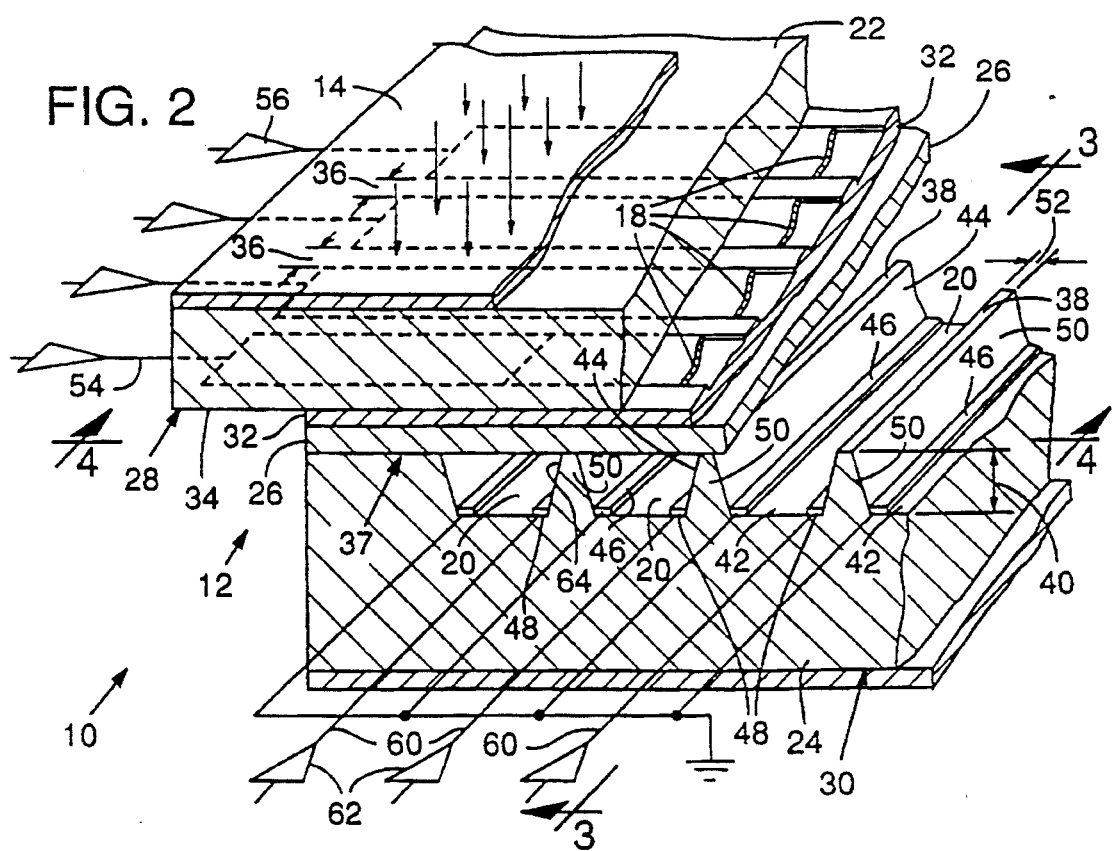
FIG. 2 is an enlarged fragmentary isometric view showing the layers of structural components forming the display panel embodying the present invention as viewed from the left side in FIG. 1.
Figure 3:
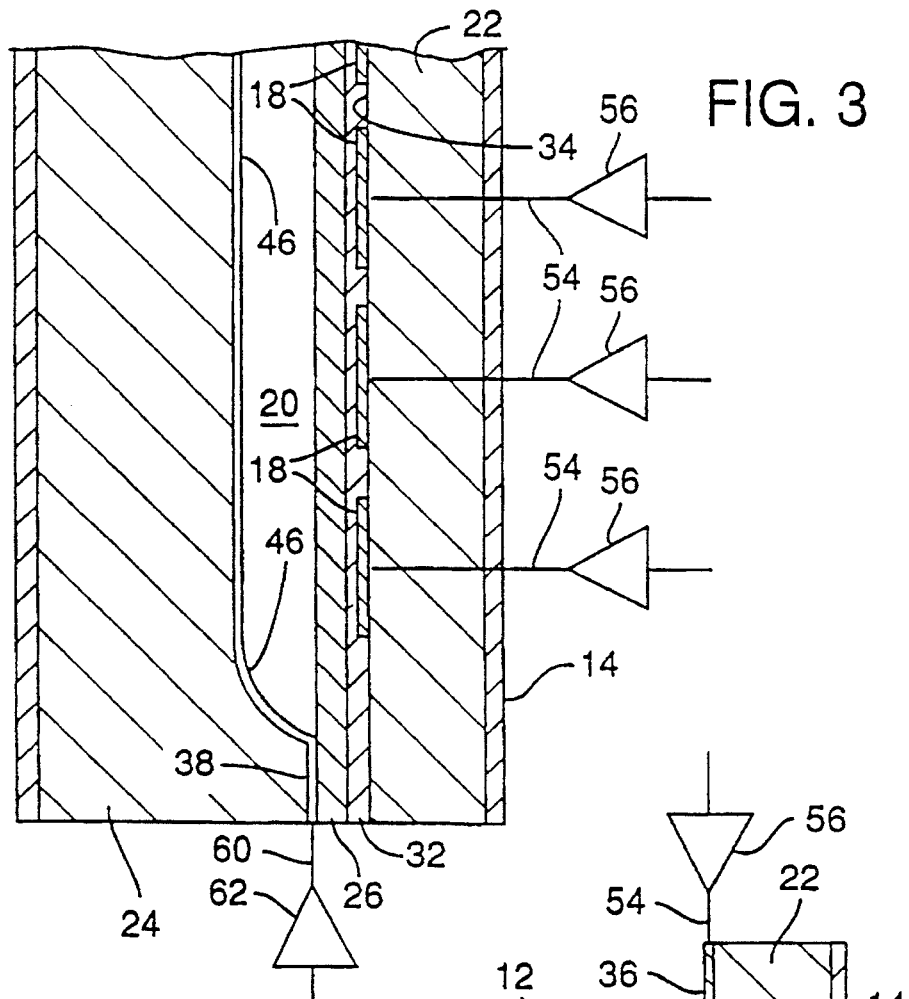
FIG. 3 is an enlarged sectional view taken along lines 3—3 of FIG. 2 and showing a pliant dielectric layer.
Figure 4:
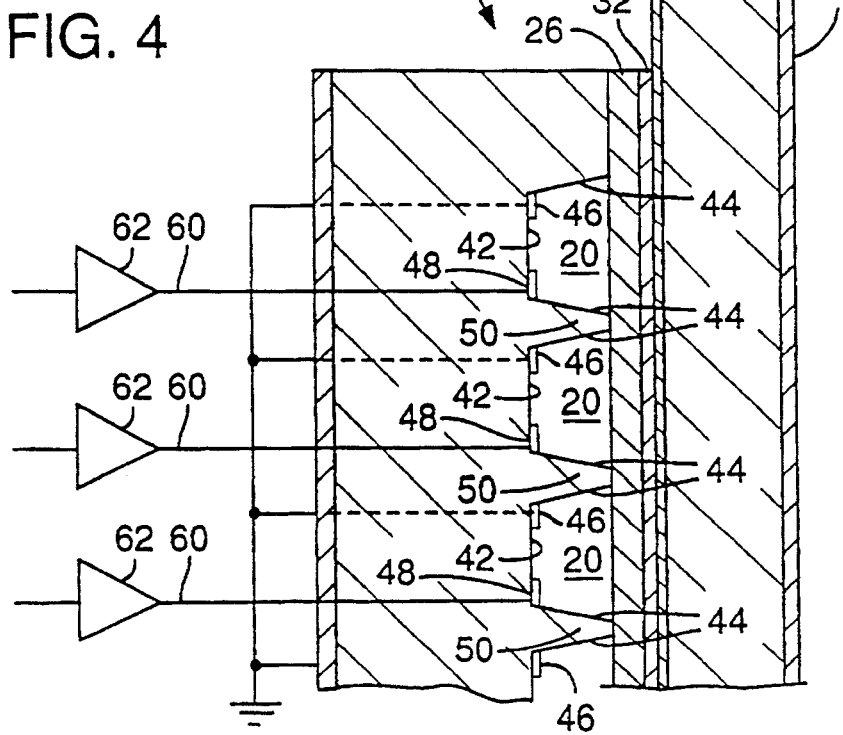
FIG. 4 is an enlarged sectional view taken along lines 4—4 of FIG. 2 and showing a pliant dielectric layer.

With reference to FIGS. 1–4, a plasma addressed flat panel display system 10 includes a display panel 12 having a display surface 14 with a rectangular planar array of nominally identical data storage or display elements 16 spaced apart by predetermined distances in the vertical and horizontal directions. Each display element 16 in the array represents the overlapping portions of column data electrodes 18 arranged in vertical columns and elongate channels 20 arranged in horizontal rows. The display elements 16 in each of the rows of channels 20 represent one line of data.

The widths of column electrodes 18 and channels 20 determine the dimensions of display elements 16, which can be rectangular. Column electrodes 18 are deposited on a major surface of a first electrically nonconductive, optically transparent substrate 22, and channels 20 are inscribed in a major surface of a second electrically nonconductive, optically transparent substrate 24. The first and second substrates are separated by an electrically nonconductive, optically transparent, pliant dielectric layer 26 comprising a polymer film in accordance with the present invention.

Display panel 12 comprises an addressing structure that includes a pair of generally parallel electrode structures 28 and 30 spaced apart by pliant dielectric layer 26 and a layer 32 of electro-optic material, such as a nematic liquid crystal. Electrode structure 28 comprises substrate 22, which is preferably glass and has deposited on its inner surface 34 column electrodes 18 which are optically transparent and form a striped pattern. Adjacent pairs of column electrodes 18 are spaced apart a distance 36, which defines the horizontal space between next adjacent display elements 16 in a row.

Electrode structure 30 comprises substrate 24, which is preferably glass, into whose top surface 37 multiple channels 20 are inscribed between land areas 38. Channels 20 have a depth 40 measured from top surface 37 or land area 38 to a base or bottom surface 42. Each channel 20 has along its length a pair of inner side walls 44 and a pair of electrodes 46 and 48. The sidewalls 44 between adjacent channels 20 define a plurality of support structures 50 with land areas 38 that support pliant dielectric layer 26. Adjacent channels 20 are spaced apart by the width 52 of the top portion of each support structure 50, which width 52 defines the vertical space between next adjacent display elements 16 in a column. Each channel 20 is filled with an ionizable gas that typically includes helium. To address display elements 16 aligned with a channel 20, the gas in the channel 20 is selectively ionized by a gas ionizing structure or an arrangement that includes electrodes 46 and 48.

Column electrodes 18 receive data drive signals developed on parallel output conductors 54 by different output amplifiers 56 of a data driver or drive circuit 58. Electrodes 48 in channels 20 receive data strobe signals developed on parallel output conductors 60 by different output amplifiers 62 of a data strobe or strobe circuit 64. The data strobe signals cooperate with reference electrode 46 to ionize the gas in channels 20. To synthesize an image on substantially the entire area of display surface 14, display system 10 employs a scan control circuit 66 that coordinates the functions of data driver 58 and data strobe 64 so that all columns of display elements 16 of display panel 12 are addressed row by row in row scan fashion.

The ionizable gas contained within each channel 20 operates as an electrical switch. The switches are connected between reference electrodes 46 and 48 and layer 32 of liquid crystal material when the gas is ionized by a data strobe signal. The ionizable gas contained within channels 20 beneath electrode structure 28 communicates with pliant dielectric layer 26 to provide a capacitatively conductive path from dielectric layer 26 to reference electrodes 46 and 48. This capacitatively conductive path carries data drive signals on column electrodes 18 to control the electro-optical properties of layer 32 of addressable material.

Pliant dielectric layer 26 functions as an isolating barrier between the ionizable gas contained within channels 20 and layer 32 of addressable material such as nematic liquid crystal. The absence of dielectric layer 26 or other similar barrier could permit either the addressable material to flow into channels 20 or the ionizable gas to contaminate the addressable material.

Pliant dielectric layer 26 preferably comprises a polymer. Synthetic polymer dielectrics are widely used, for example, as materials for electric capacitors or condensers. Polymers are easily formed as films. Wellknown synthetic polymer dielectric materials include polyethylene, polyvinylidene fluoride, polyethylene terephthalate, and polystyrene. Applicants have identified a number of different polymer materials for use in display panel 12, including polyethers, poly(ether ketones), polyimides, polyamides, poly(imide-amides), polyaromatic ethers, and their fluorinated derivatives.

Polyaromatic ethers can be formed as thin dielectric films having acceptable thermal and chemical stability. One preferred class of polymer is fluorinated poly(phenylene ether ketone) and, in particular, the series of fluorinated poly(phenylene ether ketones) "12F-PEK," which are the polymerization products of bisphenol AF and 1,1,1,3,3,3-hexafluoro-2,2-bis[4-(4-halobenzoyl)phenyl]propane. The 12F-PEK polymers have the chemical formulas and are produced in the manners set forth in U.S. Pat. No. 4,902,769 of Cassidy et al. for "Low Dielectric Fluorinated Poly(phenylene Ether Ketone) Film and Coating," which is hereby incorporated by reference.

The preferred polymer for use as dielectric layer 26 can be fabricated as an extremely thin film of about 0.0125 mm to 0.075 mm. Acceptable thin films may be formed by any of a number of standard methods that will produce continuous films of uniform thickness that are substantially free of holes or perforations. Such methods include spray-coating, painting, or casting. Films having a substantially uniform thickness in the range of about 0.0125 mm to 0.075 mm are cast easily by spreading a film-forming polymer dissolved in a suitable high grade solvent.

A sample of purified polymer is dissolved in a suitable high grade solvent to give a solution of approximately 2–10 percent weight to volume (w/v). The resulting solution is then filtered and spread to a substantially uniform thickness on clean glass casting plates of arbitrary size. The thickness of the resultant film can be controlled easily by spreading and by controlling the concentration of the solution. The glass plates and the resulting cast polymer sheet may have dimensions that exceed those of currently available 0.05 mm thick glass sheets used in plasma addressing structures. The glass casting plates are preferably cleaned with a nonionic detergent, ultrasonic agitation, and double distilled water, or by other suitable standard regimes. The film then may be allowed to dry slowly in a clean environment under filtered air for approximately 24 hours and thereafter may be dried for a shorter period at a more elevated temperature. Slow evaporation of the solvent during the initial period avoids the formation of an undesirable skin. The dried film may be released from the casting plates by soaking in deionized water.

With reference to one preferred embodiment of dielectric layer 26, approximately 5.0 grams of dried, purified 12F-PEK was dissolved in approximately 100 mL of high grade toluene to give an approximately 5 percent (w/v) solution. Other acceptable solvents include methyl ethyl ketone, chloroform, and methylene chloride. The resulting solution was filtered onto 15 cm by 30 cm clean, dry glass casting plates placed on a level surface, and then spread thin using a clean glass bar. The film was dried slowly under cover in a clean environment for about 24 hours. The dried film was released by soaking in deionized water. The resultant film had a substantially uniform depth of approximately 0.025 mm and was free of unacceptable holes or other perforations.

The 12F-PEK polymers show acceptable thermal stability. It is believed that preferred polymer materials have a TGA (thermogravimetric analysis) rating of about 450° C. or greater (i.e., a weight loss of less than about 10 percent at 450° C. at a heating rate of about 20° C./minute) and acceptably withstand thermal cycling at elevated temperatures. The 12F-PEK polymer series have TGAs in oxygen or nitrogen ranging from approximately 485° C. to approximately 550° C. A film of 12F-PEK approximately 0.025 mm thick bonded satisfactorily with glass frit to glass substrates during an elevated temperature fritting cycle and showed no signs of significant breakdown or discoloration after 60 minutes at 435° C. A film of 12-F-PEK approximately 0.025 mm thick also bonded satisfactorily to glass substrates without glass frit. The 12F-PEK polymer series forms thin films which are acceptably optically nondistorting and acceptably optically transparent in the visible region of the electromagnetic spectrum. A 0.025 mm film had a transmission efficiency of greater than approximately 85 percent for substantially all wavelengths of light between 400 nanometers and 750 nanometers. A 0.025 mm film of 12-F PEK had a transmission efficiency of greater than approximately 75 percent for the same wavelengths of light after fritting at 375° C. in a nitrogen environment. There is less discoloration of the film after an elevated temperature cycle in ambient nitrogen than there is after an elevated temperature cycle in air.

A 0.025 mm film of 12F-PEK had an acceptable dielectric constant of approximately 2.4 (at 10 GHz) and did not break down significantly when subjected to approximately 155 volts per square centimeter (approximately 1,000 volts per square inch). The thin film also appeared to have an acceptably high electrical resistivity of about at least $10^{14}$ Ohm-cm.

The 12F-PEK polymer series is readily soluble in most common organic solvents and forms films (from cast solution) readily. The polymer series also is substantially chemically inert when cast into thin films. A 0.025 mm film of 12F-PEK showed no significant water adsorption and no significant reactivity with liquid crystal material. The helium permeability coefficient for 12F-PEK is known to be approximately $31.8 \times 10^{-11}$ cm$^3$cm/(cm$^2$ s cmHg) at 35° C. Thin films of 12-F PEK have a tensile strength of approximately 3,600 Kg/cm$^2$ (approximately 10,600 pounds per square inch ("psi")) and a modulus of elasticity of about $5.5 \times 10^9$ N/m$^2$ (Newtons per square meter).

Commercially available polyimides, and in particular aromatic polyimides, also show acceptable thermal and electrical stability suitable for use as dielectric layer 26 in panel display 12. Many polyimide films also are believed acceptably chemically inert. As a class, polyimide polymers generally have TGAs in excess of 450° C. Such polyimide films are known to elongate approximately 70 percent or more at room temperature without breaking and are known to have tensile strengths exceeding approximately 6,800 Kg/cm(approximately 20,000 psi) at room temperature and dielectric constants of about 3.0 or greater.

One polyimide film, sold under the name Kapton™ by the Du Pont Corp. of Wilmington, Del., is the polymer product of the reaction of pyromelittic anhydride and 4,4' diaminophenyl ether (bis(4-aminophenyl)ether). A 0.025 mm film made of Kapton™ did not react significantly with liquid crystal material and was acceptably impermeable to helium, air, and water vapor. The 0.025 mm Kapton™ film bonded satisfactorily with glass frit to the glass substrate of plasma addressed displays during an elevated temperature fritting cycle and showed no signs of significant breakdown after 60 minutes at 435° C.

The 0.025 mm film of Kapton™ had an acceptable dielectric constant of approximately 3.1 or higher (at 10 GHz) and did not break down significantly when subjected to approximately 155 volts per square centimeter (approximately 1,000 volts per square inch). The thin film also appeared to have an acceptably high electrical resistivity of about at least $10^{14}$ Ohm-cm. Although it has many desirable characteristics, Kapton™ film is not ideal for use as pliant dielectric layer 26 because Kapton™ has an amber color and is not optically transparent throughout the visible spectrum.

Preferred materials for dielectric layer 26 of plasma addressed display 12 are substantially optically clear and nondistorting when made into a thin layer or film. Preferable materials absorb little light in the visible region of the electromagnetic radiation spectrum (corresponding to wavelengths of light ranging from approximately 400 nanometers to 750 approximately nanometers) and typically have a transmission efficiency of about 80 percent or more of incident light. Thin films of such materials exhibit little birefringence and do not scatter light significantly. Preferred materials show little or no discoloration after exposure to wavelengths of light greater than 400 nanometers.

When made into a film within the range of approximately 0.0125 mm to 0.075 mm, the thickness of dielectric layer 26 is preferably substantially uniform and free from holes or perforations. The thickness of the preferred polymer film does not vary by more than approximately 10 percent of the total average depth.

Also, when made into a thin layer or film, the preferred material for use as dielectric layer 26 has good mechanical properties characterized by a high modulus of elasticity and a high tensile strength. A coefficient of thermal expansion of comparable to plasma glass also appears desirable.

Preferred materials for use in pliant dielectric layer 26 are good dielectrics. It is believed that as a 0.0125 mm to 0.075 mm film, dielectric layer 26 has a dielectric constant of about 2 or greater. It is believed that even a dielectric constant of up to about 10 or greater would be desirable. A high electrical resistivity of greater than about $10^{14}$ Ohm-cm and the ability to resist breakdown by 155 volts also appear desirable. It is believed that the preferred dielectric layer should be a polymer film having greater than about 70 percent transmissive efficiency for wavelengths of light in the visible region after being subjected to temperatures up to about 400° C. for about 60 minutes, a dielectric constant greater than 2.0, a tensile strength greater than 2,400 Kg/cm², a modulus of elasticity greater than $1.0 \times 10^9$ N/m², a TGA higher than about 450° C., the ability to bond with glass, retention of the properties of substantial optical clarity, greater than about 80 percent transmissive efficiency for wavelengths of light in the visible region, an electrical resistivity of about $10^{13}$ to $10^{15}$ Ohms per centimeter, and the ability to resist about 155 volts without significant breakdown, after being subjected to temperatures up to about 400° C. for about 60 minutes.

Also, as a thin layer or film, the preferred material for use in pliant dielectric layer 26 is capable of use as an alignment layer for aligning the direction of the molecules of the liquid crystal layer contacting the dielectric layer.

In a preferred embodiment, pliant dielectric layer 26 includes a thin polymer film having the primary qualities of high optical clarity, retention of high optical clarity after thermal cycling at elevated temperature, and high thermal stability. It will be obvious to those having skill in the art that many different polymers may be included in the present invention without departing from the underlying principles thereof. The scope of the present invention should, therefore, be determined only by the following claims.

I claim:

1. A plasma addressing structure, comprising:

a data electrode and a pliant dielectric layer having a first major surface and a second major surface, with the first major surface of the pliant dielectric layer in communication with the data electrode, and in which the pliant dielectric layer is a thin polymer film having a substantially uniform thickness, a dielectric constant greater than about 2.0, a tensile strength greater than about 2,400 Kg/cm², a modulus of elasticity greater than about $1.0 \times 10^9$ N/m², a TGA rating greater than about 450° C., an ability to bond with glass, a visible light transmissive efficiency greater than about 70 percent, an electrical resistivity of about $10^{13}$ to $10^{15}$ Ohms per centimeter, and an electrical breakdown voltage greater than about 155 volts per square centimeter;

an ionizable gaseous medium in communication with the second major surface of the pliant dielectric layer and an electrical reference; and an ionizing electrode in communication with the ionizable gaseous medium adapted to selectively ionize the ionizable gaseous medium to provide an interruptible electrical connection between the data electrode and the electrical reference.

2. The plasma addressing structure of claim 1 in which a layer of material having electro-optic properties is disposed between the data electrode and the first major surface of the pliant dielectric layer so that a property of the layer of electro-optic material changes in response to a data signal appearing on the data electrode.

3. The plasma addressing structure of claim 2 in which the electro-optic material is a liquid crystal material and the pliant dielectric layer is capable of aligning the direction of liquid crystal molecules that contact the pliant dielectric layer.

4. The plasma addressing structure of claim 1 in which the pliant dielectric layer maintains the substantially uniform thickness, the dielectric constant greater than about 2.0, the tensile strength greater than about 2,400 Kg/cm², the modulus of elasticity greater than about $1.0 \times 10^9$ N/m², the TGA rating greater than about 450° C., the ability to bond with glass, the visible light transmissive efficiency greater than about 70 percent, the electrical resistivity of about $10^{13}$ to $10^{15}$ Ohms per centimeter, and the electrical breakdown voltage greater than about 155 volts per square centimeter after being subjected to a temperature greater than about 400° C. for about 60 minutes.

5. The plasma addressing structure of claim 1 in which the polymer film comprises one of a poly(ether ketone), a polyimide, a polyamide, a poly(imideamide), a polyaromatic ether, and a fluorinated derivative thereof.

6. The plasma addressing structure of claim 1 in which the polymer film is selected from the group consisting of poly(ether ketones), polyimides, polyamides, poly(imideamides), polyaromatic ethers, or a fluorinated derivative thereof.

7. The plasma addressing structure of claim 1 in which the polymer film comprises a polyimide or its fluorinated derivative.

8. The plasma addressing structure of claim 1 in which the polymer film comprises a polyaromatic ether or its fluorinated derivative.

9. The plasma addressing structure of claim 1 in which the pliant dielectric layer comprises a polymer film that includes 12F-PEK.

10. The plasma addressing structure of claim 1 in which the substantially uniform thickness of the thin polymer film is in a range from about 0.0125 millimeters to about 0.075 millimeters.

11. The plasma addressing structure of claim 4 in which the polymer film is able to bond directly to glass by employing a glass frit material.

* * * * *